United States Patent
McCullough et al.

(10) Patent No.: US 7,843,693 B2
(45) Date of Patent: Nov. 30, 2010

(54) METHOD AND SYSTEM FOR REMOVING HEAT

(75) Inventors: Edward D. McCullough, Riverside, CA (US); James P. Huang, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 281 days.

(21) Appl. No.: 11/934,135

(22) Filed: Nov. 2, 2007

(65) Prior Publication Data

US 2009/0116192 A1    May 7, 2009

(51) Int. Cl.
*H05K 7/20* (2006.01)
*H01L 23/34* (2006.01)
*F28D 15/00* (2006.01)
*H01B 7/42* (2006.01)
*F25D 15/00* (2006.01)

(52) U.S. Cl. .................. 361/700; 361/679.52; 257/714; 165/80.4; 165/80.5; 165/104.33; 165/104.26; 174/15.1; 174/15.2; 174/252; 62/119

(58) Field of Classification Search ............ 361/679.52, 361/679.53, 699, 700; 257/714; 165/80.4, 165/80.5, 104.33, 104.26; 174/15.1, 15.2, 174/252; 62/119
See application file for complete search history.

(56) References Cited

U.S. PATENT DOCUMENTS 4,882,454 A    11/1989   Peterson et al.

| 7,063,129 B2 * | 6/2006 | Makino et al. ......... 165/104.26 |
| 2005/0006115 A1 | 1/2005 | Ding et al. |
| 2005/0126760 A1 | 6/2005 | Makino et al. |
| 2006/0144565 A1 * | 7/2006 | Tsai et al. .............. 165/104.26 |
| 2006/0146496 A1 | 7/2006 | Asfia et al. |
| 2007/0284089 A1 * | 12/2007 | Vadakkanmaruveedu et al. 165/104.26 |

FOREIGN PATENT DOCUMENTS

| WO | 2006073269 | 7/2006 |
| WO | 2007019558 | 2/2007 |

OTHER PUBLICATIONS

International Search Report, corresponding to International Patent Application No. PCT/US2008/078833, dated Mar. 24, 2009.
Written Opinion, corresponding to International Patent Application No. PCT/US2008/078833, dated Mar. 24, 2009.

* cited by examiner

*Primary Examiner*—Zachary M Pape
(74) *Attorney, Agent, or Firm*—Charles L. Moore; Moore & Van Allen, PLLC

(57) ABSTRACT

A system for removing heat includes a sealed container, and an evaporator, housed within the sealed container. The evaporator includes an evaporator inlet, a plurality of evaporator outlet ports and a plurality of tubes, each tube connecting the evaporator inlet with a tube outlet to the sealed container. The system further includes a condenser, also housed within the sealed container, having a plurality of condenser inlet ports from the sealed container, a condenser outlet and closed condenser channels connecting the condenser inlet ports with the condenser outlet. The system further includes a conduit joining the condenser outlet to the evaporator inlet.

25 Claims, 2 Drawing Sheets

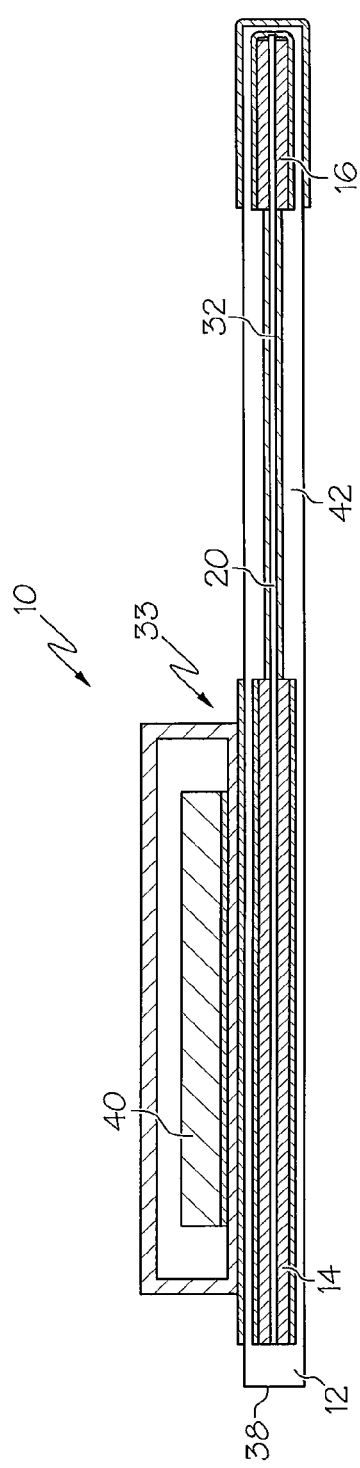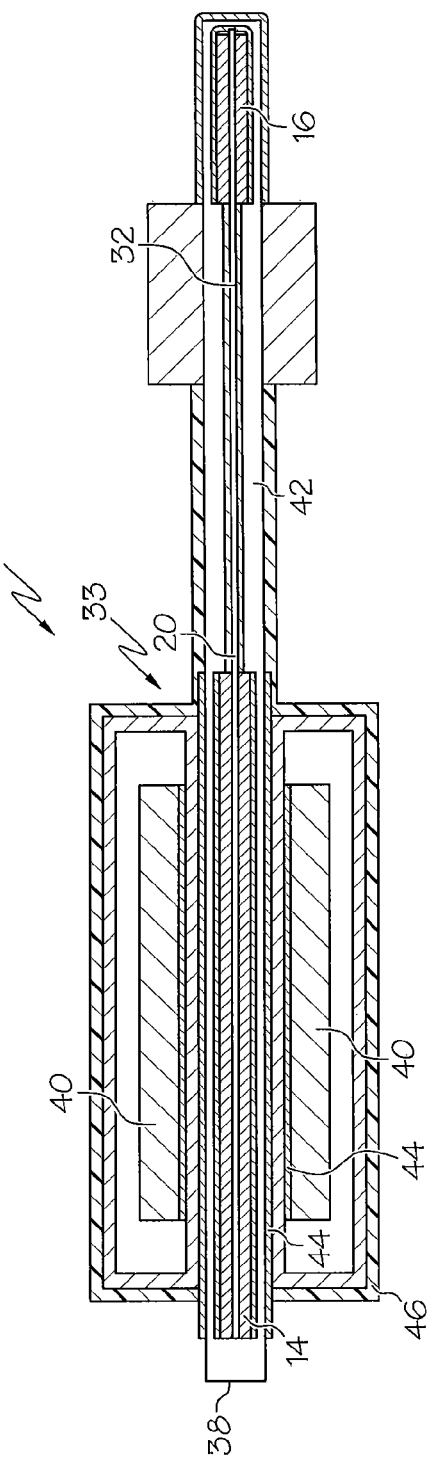

METHOD AND SYSTEM FOR REMOVING HEAT

BACKGROUND

The present invention relates generally to a method and system of heat removal. In particular, the present invention is directed to a method and system for removing heat from electronic chips and integrated circuit boards.

In the electronics industry, circuit boards and electronic chips create heat during operation. If heat is allowed to build up, the electronic chip or circuit board may malfunction or cause a part or the entire system to shut down. Thus, in order to avoid a system or part malfunction, the heat build up must be effectively dissipated.

There are many existing methods of heat dissipation from electronic components and systems. These include pulsating heat pipes, forced gas cooling and passive heat transfer directly to the system or component structure. The systems described require the movement of a coolant from the heat source to a remote location where the heat is dissipated or dumped. Such systems are voluminous and heavy. In many electronics applications, size and weight are important factors. Thus, the existing systems for heat removal in electronic components inhibit designers from creating electronic systems that are smaller in size and lighter in weight.

Accordingly, it is desired to provide a system and method for effectively removing heat from an integrated circuit board or electronic chip that enables the circuit board or chip assembly to become smaller in size and/or lighter in weight due to the decrease in size and weight of the heat removal system.

It is further desired to provide a system for effectively removing heat at its source so that heat accumulation is minimized.

SUMMARY

The present invention is directed to a system and method for heat removal. In particular, the present invention is directed to a closed system for removing heat from an electronic component. The system includes a first conduit containing at least one substance in liquid phase in thermal communication with a heat source. The first conduit is part of an evaporator for enabling the substance to move from liquid to gas phase. The system further includes a condenser for enabling the substance to move from gas to liquid phase. A second conduit joins the evaporator to the condenser and enables the substance to move from the evaporator to the condenser. The system also includes a condenser outlet connected with the first conduit for enabling the substance in liquid phase to exit the condenser and return to thermal communication with the heat source.

It is a further aspect of the present invention to provide a method of removing heat. The method includes locating a first conduit in thermal communication with a heat source and moving a substance in liquid phase through the first conduit to an evaporator. The system further includes causing the evaporator to change the substance from liquid to gas phase, moving the substance from the evaporator to a condenser, causing the substance to change from a gas to a liquid, and causing the liquid to return via the first conduit to thermal communication with the heat source.

It is yet a further aspect of the present invention to provide a heat exchanger having a heat source in thermal communication with a thermal ground plane, the thermal ground plane having a carbon nanotube structure having a plurality of channels. The channel are adapted to move a gas phase material from a first position in the channel to a second position in the channel, the first position of the channel connected to an evaporator to convert a liquid material to a gas phase and the second position of the channel connected to a condenser to convert the gas phase back to a liquid phase.

It is still a further object of the present invention to provide for a printed circuit board with an integrated heat exchanger. The printed circuit board having at least one heat producing electronic device and at least one evaporator having a plurality of nanotube channels in thermal communication with the electronic device. The nanotube channels extend along the surface area of the electronic device and are adapted to flow a gas phase liquid. The printed circuit board further includes a thermal ground plane having a porous structure for transferring gas phase material from the evaporator to a condenser. The condenser is adapted to convert the gas phase material to a liquid and is connected to a conduit to transport the liquid. The conduit is connected to the evaporator such that the liquid is transported from the condenser to the evaporator by means of wicking.

BRIEF DESCRIPTION OF THE DRAWINGS

FIG. 1 is a side sectional view of an exemplary system for heat removal in accordance with an embodiment of the present invention.

FIG. 2 is a side sectional view of an exemplary system for heat removal in accordance with another embodiment of the present invention.

DESCRIPTION

Figure 3:
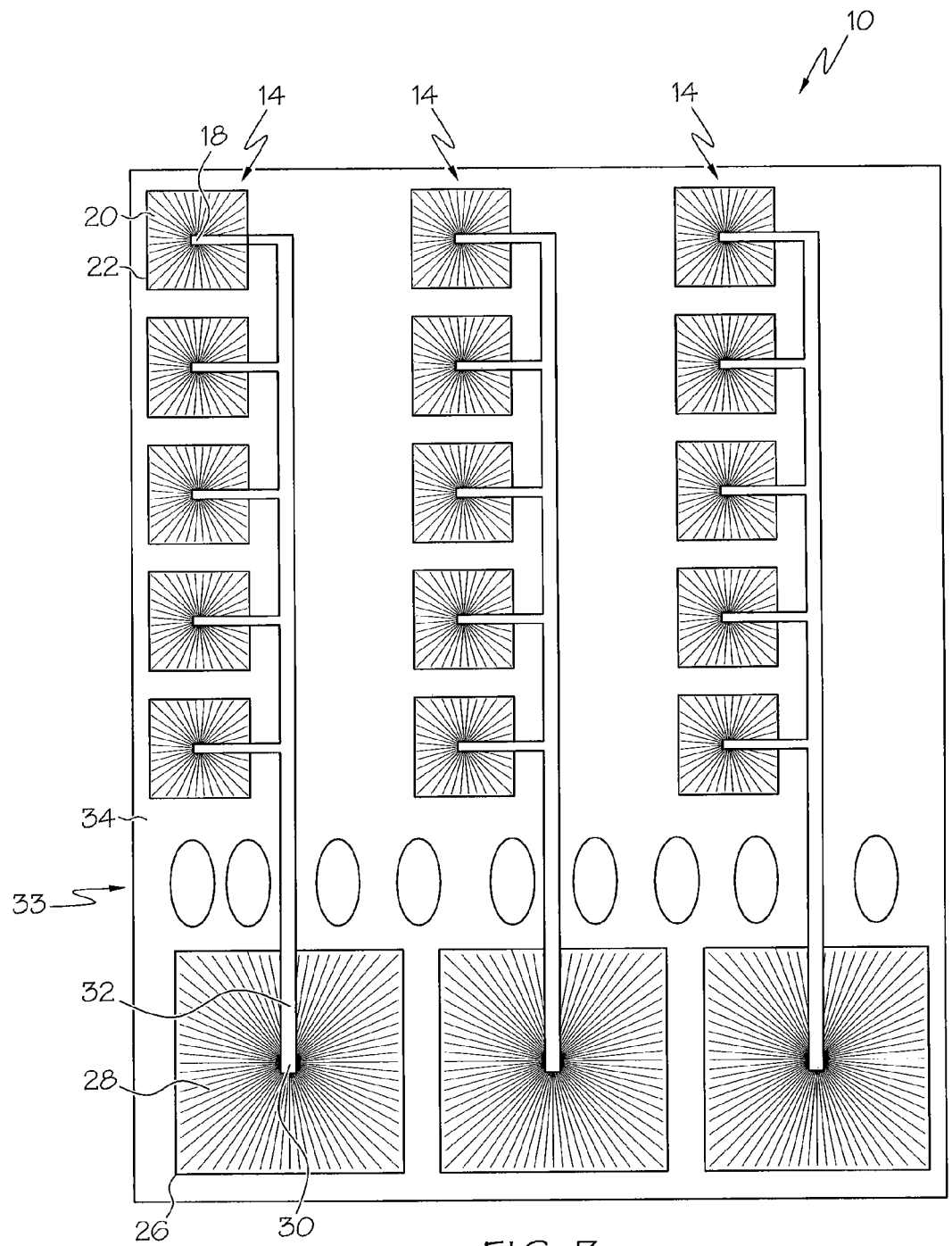
FIG. 3 is a top sectional view of the exemplary system of FIG. 1.

The following detailed description of embodiments refers to the accompanying drawings, which illustrate specific embodiments of the invention. Other embodiments having different structures and operations do not depart from the scope of the present invention.

Referring now to the drawings, wherein like reference numerals designate corresponding or similar elements throughout the several views, FIG. 1 is directed to a schematic diagram of an exemplary heat removal system in accordance with an embodiment of the present invention. The heat removal system is referred to generally as item 10. The system 10 includes a sealed container 12 in which a series of evaporators 14 and condensers 16 are housed. Referring also to FIG. 3, each evaporator 14 includes an inlet port 18 and a plurality of tubes 20 extending radially from the inlet port 18. At the end of each tube 20 is an evaporator tube outlet 22.

Referring to FIG. 1, the condenser 16 is enclosed within the sealed container 12. The condenser 16 includes a plurality of condenser inlets 26 and closed condenser channels 28, as shown in FIG. 3. The closed condenser channels 28 extend radially inward from the condenser inlets 26 to a condenser outlet 30. A conduit 32 connects the condenser outlet 30 with the plurality of evaporator inlet ports 18.

The structure of the system 10 is described as follows. Both the evaporator 14 and condenser 16 are made from thin sheets 34 of conductive material such as copper, aluminum a conductive alloy or other conductive material. The evaporator tubes 20 and condenser channels 28 are preferably between about 100 and about 400 microns in diameter. The tubes 20, channels 28 and conduit 32 are created or formed on the sheet 34 by depositing carbon nanotubes on the sheet, or by a mold. Other ways to create or form the tubes 20, channels 28 and conduit 32 may be used to achieve the dimensions and qualities herein described. The evaporator 14 is closed by sealing the top of the sheet with a polymer film, not shown, or similar material.

It is preferred that the entire system 10 is encased in steel 38 or similar material. This is due to the fact that the present invention is designed to operate where the system is exposed to accelerations of up to about 20 G.

Carbon nanotubes are grown in fields or "forests" ranging in height from 100 to 400 microns. Since the carbon nanotubes can be grown in masked patterns with features sizes similar to transistors, the nanotubes can be used to form radial patterns in the evaporators 14 and condensers 16, along with the conduits 32.

The carbon nanotube structures are grown on substrates by depositing carbon nanotubes thereon, or by using an insert generated by a mold and a press that provides the required structure to implement the same capability.

The evaporators 14 are located on an integrated circuit board 33 underneath or over an electronic chip 40 or other heat source. The close proximity between the electronic chip 40 and evaporator 14 is important to maximize the heat transfer. It is recommended to use carbon nanotubing or the like as the interface between the heat source and evaporator. This helps to maximize the heat transfer away from the heat source. The evaporator 14 may be between about 10 cm and about 20 cm from the heat source. The heat source may expel about 100 watts of thermal energy.

In use, a substance, such as water, is placed within the evaporator inlet port 18. As the water moves from the evaporator inlet port 18 and through the tubes 20, it changes to steam as it is exposed to the heat from the electronic chip 40. As the liquid in the tube 20 moves proximate to the electronic chip 40, it serves to dissipate the heat from the chip 40 and cools the chip 40 down. As the water in the tube 20 changes to steam, it exits the tube 20 via the tube outlet 22. Because the system is closed, the expanded volume of water to steam increases the pressure. The pressure forces the steam into the condenser inlets 26 and forces the steam to travel through the condenser channels 28. As the water or other substance moves through the condenser channels 28, it is exposed to a cooler temperature and changes from steam to water. The water moves out of the condenser outlet 30 and along the conduits 32 to the evaporator inlet ports 18 via wicking.

As the liquid enters the evaporator inlet port 18, the cycle begins again. The liquid-to-gas volume differential may be greater than about 1000.

The carbon nanotube structure can be grown in certain patterns. Thus, the tubes for the evaporators 14 can be shaped similar to the heat source against which they will be mounted. It should be noted that as the evaporators 14 are located proximate to a heat source, the condensers are located in an area remote to the heat source and at a place where the heat may be dissipated effectively. This may be an edge of the printed circuit board or near a cold wall of the chassis enclosure or any other location that offers a decreased temperature to enable the substance to make the phase change from gas to liquid.

The carbon nanotube structures in the pressed film or sheet 34 must be positioned so as to control the inter feature distances to ensure that all dimensions are less than a specific value to ensure the column of water in the wick cannot be broken due to operation in a 20 G acceleration field. The actual function describing the ratio of capillary force to the force of gravity (or inertial force) is nonlinear. For example, for distances of 44 nm, the ratio is 108 to 1. In addition, at 7 nm radii, the ratio is $10^{11}$ to 1. A number of techniques ranging from masked deposition to laser machining are capable of generating features at these scales.

It should be further noted that due to the system's exposure to acceleration levels of up to about 20 G, the printed circuit boards must be made so as to withstand this level of pressure applied thereto and prevent the expanding gasses from bursting the structure due to the application of force. This can be accomplished by the use of vias plated through with metal in sufficient quantities to hold the pressure.

With respect to the operation of the present invention, while the mass flow rates of the liquid and gas phases in the present invention are exactly the same under steady state conditions, the volume flow rates differ by a factor of about 1000. For this reason it is necessary to partition available cross section areas so that the gas phase is favored to reflect the 1000 to 1 reality. Additional cross sectional area allocated to the wick beyond what is necessary will lower system performance. All that is needed to determine the gas flow rate is knowledge of the liquid involved, the operating temperature and the required power level.

FIG. 2 is a side sectional view of an exemplary system 11 for heat removal in accordance with another embodiment of the present invention. The embodiment of FIG. 2 is similar in operation to that of FIG. 1 and somewhat similar in structure. However, FIG. 2 illustrates the use of the system 11 to remove heat from at least two electronic chips 40. The evaporator 14 is shown sandwiched between a pair of electronic chips 40. A carbon nanotube interface 44 is located between the chip 40 and the evaporator 14 so as to maximize the heat transfer from the chip 40 to the evaporator 14. The evaporator 14 includes the evaporator tubes 20 similar to that also shown in FIG. 3. The tubes 20 contain liquid. The liquid adjacent to the chip helps to keep the chip cool. As the liquid, proximate to the heat source, absorbs the heat, it turns to a gas. The gas moves along a gas pathway 42 to the condenser 16. The condenser 16 is located remotely from the heat source so as to most effectively dump the heat. As discussed above, as the gas moves through the condenser 16, it returns to its liquid form. In its liquid form, the liquid moves via wicking through the conduit 32 that connects the condenser 16 with the evaporator inlet ports 18. In this embodiment, the chip 40 and gas pathway 42 areas are insulated with an appropriate insulating material 46.

It should be noted that while the embodiment of the present invention shown includes a thermal barrier between the heat source and the carbon nanotubing, the invention further anticipates providing direct contact between the heat source and the carbon nanotubing. This can be accomplished by using heat flow or light from the carbon nanotubing to an interface with the heat source. Alternatively, biological entities may be used to continue to catalyze the continued growth of the nanotubes until they directly contact the external surface of the heat source. With this approach, the full heat transfer capability of a significant number of nanotubes is available for heat transfer. Thus making the heat transfer more efficient and effective.

While the invention has been described in detail with respect to specific preferred embodiments thereof, numerous modifications to these specific embodiments will occur to those skilled in the art upon a reading and understanding of the foregoing description. Such modifications are embraced within the spirit and scope of the present invention.

We claim:

1. A system for removing heat comprising:
   a sealed container;
   an evaporator, housed within the sealed container, for thermal communication with a heat source, the evaporator comprising an evaporator inlet, a plurality of tubes, each tube having a tube inlet connected to the evaporator inlet, and a tube outlet to the sealed container, each tube containing at least one substance;

a condenser, housed within the sealed container, the condenser comprising a plurality of condenser inlet ports from the sealed container, a condenser outlet, and a plurality of condenser channels connecting the plurality of condenser inlet ports with the condenser outlet; and a conduit joining the condenser outlet to the evaporator inlet, whereby as the substance comes in thermal communication with the heat source, the substance changes from liquid to gas and moves out of the evaporator, the expanded volume forces the gas along a gas pathway within the sealed container and into one of the condenser inlet ports where it changes from gas to liquid as the substance travels along the length of the condenser channel, and the liquid is wicked from the condenser outlet through the conduit and into the evaporator inlet, wherein the conduit joining the condenser outlet to the evaporator inlet is surrounded by the gas pathway.

2. The system of claim 1 wherein the heat source comprises an electronic chip or integrated circuit board.

3. The system of claim 1 wherein the sealed container is exposed to acceleration levels of up to about 20 G.

4. The system of claim 1 wherein the tubes are made from carbon nanotubing.

5. The system of claim 1 wherein the tube diameter ranges from about 100 to about 400 microns.

6. The system of claim 1 wherein the liquid-to-gas volume differential is greater than about 1000.

7. The system of claim 1 wherein the heat source expels about 100 watts of thermal energy.

8. The system of claim 1 wherein the evaporator is between 10 cm and 20 cm from the heat source.

9. The system of claim 1, wherein the plurality of tubes of the evaporator extends radially outward from the evaporator inlet to the tube outlet of each tube, and wherein the plurality of condenser channels extends radially inward from the condenser inlet of each condenser channel to the condenser outlet.

10. A method for removing heat, comprising:

removing heat from a heat source by disposing a plurality of evaporator tubes containing a liquid in thermal communication with a heat source to cause the liquid to change to a gas in response to receiving heat from the heat source, wherein the gas is forced into a sealed container in which the plurality of evaporator tubes are housed;

condensing the gas back to a liquid by cooling the gas in a plurality of condenser channels, wherein the gas is forced along a gas pathway formed by the sealed container and into the plurality of condenser channels housed in the sealed container; and wicking the liquid to an evaporator inlet port in communication through a conduit with the plurality of condenser channels to remove more heat from the heat source, wherein the conduit is surrounded by the gas pathway.

11. The method of claim 10, wherein removing the heat from the heat source comprises placing the plurality of evaporator tubes in a predetermined configuration relative to the heat source.

12. The method of claim 10, wherein condensing the gas back to a liquid comprises placing the plurality of condenser channels in a predetermined configuration.

13. The method of claim 10 wherein the liquid is water or a water based solution.

14. The method of claim 10 wherein the heat source comprises an electronic chip or integrated circuit board.

15. The method of claim 10 wherein the water-to-gas ratio volume differential is greater than about 1000.

16. The method of claim 10 wherein the heat exchanger is exposed to acceleration levels of up to about 20 G.

17. The method of claim 10 wherein the channels are made of carbon nanotubing.

18. The method of claim 10 wherein the channels are from about 100 to about 400 microns in diameter.

19. A heat exchanger comprising:

a sealed container containing a substance;

an evaporator comprising a plurality of evaporator tubes extending from an inlet port of the evaporator to an outlet port of each evaporator tube;

a condenser comprising an outlet port and a plurality of condenser channels, the condenser channels extending from an inlet port of each channel to the condenser outlet port; and a conduit connecting the outlet port of the condenser to the inlet port of the evaporator, wherein the substance changes from liquid to gas in response to being heated in the evaporator, the gas being forced along a gas pathway within the sealed container caused by volume expansion of the gas and into the condenser where the gas condenses to liquid, the liquid being wicked from the condenser outlet through the conduit and into the evaporator inlet, wherein the conduit joining the condenser outlet to the evaporator inlet is surrounded by the gas pathway.

20. The heat exchanger of claim 19 wherein the heat exchanger is exposed to acceleration levels of up to about 20 G.

21. The heat exchanger of claim 19 wherein the channels are between about 100 and about 400 microns in diameter.

22. The heat exchanger of claim 19 wherein the material is a water based solution.

23. A printed circuit board with an integrated heat exchanger comprising:

at least one heat producing electronic device, at least one evaporator comprising a plurality of nanotube channels in thermal communication with the electronic device, the nanotube channels extending along the surface area of the electronic device and being adapted to flow a gas phase liquid;

a thermal ground plane comprising a porous structure for transferring gas phase material from the evaporator to a condenser, the condenser being adapted to convert the gas phase material to a liquid and being connected to a conduit to transport the liquid, whereby the conduit is connected to the inlet of the evaporator such that the liquid is transported from the condenser to the evaporator by means of wicking, the conduit being surrounded by a gas pathway.

24. The printed circuit board of claim 23 wherein the heat exchanger is exposed to acceleration levels of up to about 20 G.

25. The printed circuit board of claim 23 wherein the nanotube channels are from about 100 to about 400 microns in diameter.

* * * * *